(12) United States Patent
Singamsetti

(10) Patent No.: US 8,290,745 B2
(45) Date of Patent: Oct. 16, 2012

(54) SYSTEMS AND METHODS FOR IDENTIFYING FAULTY SENSORS WITHIN A POWER GENERATION SYSTEM

(75) Inventor: V N S Raju Singamsetti, Ambajipeta Mandal (IN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/971,215

(22) Filed: Dec. 17, 2010

(65) Prior Publication Data

US 2012/0065936 A1    Mar. 15, 2012

(51) Int. Cl.
*G06F 11/30* (2006.01)
*G01R 31/36* (2006.01)
(52) U.S. Cl. .................. 702/183; 702/63; 320/101
(58) Field of Classification Search .......... 702/57, 702/58, 60–63, 182–185; 700/108, 286, 700/297; 340/3.43, 6.1, 657, 661; 250/203.1, 250/203.4; 320/101
See application file for complete search history.

(56) References Cited

U.S. PATENT DOCUMENTS

| | | | |
|---|---|---|---|
| 6,278,052 | B1 | 8/2001 | Takehara et al. |
| 6,892,165 | B2 | 5/2005 | Yagi et al. |
| 2004/0123894 | A1 | 7/2004 | Erban |
| 2008/0030354 | A1 | 2/2008 | Oldenkamp |
| 2009/0014057 | A1 | 1/2009 | Croft et al. |
| 2009/0182532 | A1* | 7/2009 | Stoeber et al. ............... 702/183 |

FOREIGN PATENT DOCUMENTS

JP    200040838 A    2/2000

* cited by examiner

*Primary Examiner* — Manuel L Barbee
(74) *Attorney, Agent, or Firm* — James McGinness, Esq.; Armstrong Teasdale LLP

(57) ABSTRACT

A photovoltaic (PV) power generation system is described. The system includes at least one PV module comprising a plurality of PV cells, a plurality of sensors, and a processing device communicatively coupled to the plurality of sensors. The processing device is configured to determine a power output each of the plurality of PV cells, receive data from the plurality of sensors, and identify a faulty sensor within the plurality of sensors based at least partially on the determined power output and the received data.

20 Claims, 2 Drawing Sheets

SYSTEMS AND METHODS FOR IDENTIFYING FAULTY SENSORS WITHIN A POWER GENERATION SYSTEM

BACKGROUND OF THE INVENTION

The embodiments described herein relate generally to a photovoltaic (PV) power generation system, and more specifically, to methods and systems for monitoring sensors included within with the PV power generation system.

Solar energy has increasingly become an attractive source of energy and has been recognized as a clean, renewable alternative form of energy. Solar energy in the form of sunlight may be converted to electrical energy by solar cells. A more general term for devices that convert light to electrical energy is "photovoltaic cells." Sunlight is a subset of light and solar cells are a subset of photovoltaic cells. A photovoltaic cell comprises a pair of electrodes and a light-absorbing photovoltaic material disposed therebetween. When the photovoltaic material is irradiated with light, electrons that have been confined to an atom in the photovoltaic material are released by light energy to move freely. Thus, free electrons and holes are generated. The free electrons and holes are efficiently separated so that electric energy is continuously extracted. Current commercial photovoltaic cells use a semiconductor photovoltaic material, typically silicon.

In order to obtain a higher current and voltage, solar cells are electrically connected to form a solar module. In addition to a plurality of solar cells, the solar module may also include sensors, for example, an irradiance sensor, a temperature sensor, and/or a power meter. The irradiance sensor detects a flux of radiation (e.g., solar flux) on a surface of the solar module and provides a controller with an irradiance signal proportional to the solar flux. Based on an output of the irradiance sensor, energy expected to be produced by the solar module may be calculated and/or operation of the solar module may be adjusted. For example, the configuration of the solar module may be adjusted to maximize the solar flux on the surface of the solar module. Furthermore, the output of the irradiance sensor may indicate that there is an excessive buildup of dirt on the surface of the solar module. In response, the controller may direct a cleaning device to spray the solar module with water or other appropriate solvent or to vibrate the module to remove the accumulated dirt. Faulty operation of an irradiance sensor is difficult to detect and may lead to misinterpretation of the actual power produced by the panels. Typically, a fault in an irradiance sensor is detected by conducting a root cause analysis of all components within the solar module based on historical data and log files of all the components.

BRIEF DESCRIPTION OF THE INVENTION

In one aspect, a photovoltaic (PV) power generation system is provided. The system includes at least one PV module comprising a plurality of PV cells, a plurality of sensors, and a processing device communicatively coupled to the plurality of sensors. The processing device is configured to determine a power output of each of the plurality of PV cells, receive data from the plurality of sensors, and identify a faulty sensor within the plurality of sensors based at least partially on the determined power output and the received data.

In another aspect, a control system configured to identify faulty sensors within a photovoltaic (PV) power generation system that includes a plurality of photovoltaic (PV) cells is provided. The control system includes a processing device coupled to a plurality of sensors, each of the plurality of sensors is associated with a PV cell of the plurality of PV cells. The processing device is configured to receive sensor signals from each of the plurality of sensors including a first sensor signal from a first sensor associated with a first PV cell. The processing device is further configured to determine a sensor signal average and determine a power output of each of the plurality of PV cells including a first power output of the first PV cell. The processing device is further configured to determine an average power output and identify a faulty sensor based at least partially on a comparison of the first sensor signal and the sensor signal average and a comparison of the first power output and the average power output.

In yet another aspect, a method for monitoring operation of a first sensor of a plurality of sensors within a photovoltaic (PV) power generation system is provided. The PV power generation system includes a plurality of PV cells and a system controller. The method includes receiving a first sensor signal from the first sensor, the first sensor associated with a first PV cell of the plurality of PV cells. The method also includes receiving a second sensor signal from a second sensor, the second sensor associated with a second PV cell of the plurality of PV cells. The method also includes determining a first power output of the first PV cell and a second power output of the second PV cell and determining the first sensor is faulty based at least partially on a comparison of the first sensor signal and the second sensor signal and a comparison of the first power output and the second power output.

DETAILED DESCRIPTION OF THE INVENTION

The methods and systems described herein facilitate automatic identification of faulty sensors within a power generation system. For example, the methods and systems described herein use sensor outputs of neighboring sensors to determine if a sensor is operating properly. To determine if a first sensor is operating properly, a sensor output of the first sensor is compared to a sensor output of at least one neighboring sensor. If the sensor outputs are not substantially similar, a power output of a solar cell associated with the first sensor is compared to a power output of at least one neighboring solar cell. If the power outputs are substantially similar, the systems and methods described herein identify the first sensor as faulty.

Technical effects of the methods and systems described herein include at least one of: (a) receiving a first sensor signal from a first sensor associated with a first photovoltaic (PV) cell; (b) receiving a second sensor signal from a second sensor associated with a second PV cell; (c) determining a first power output by the first PV cell and a second power output by the second PV cell; and, (d) determining a functionality of the first sensor based on a comparison of the first sensor signal and the second sensor signal and a comparison of the first power output and the second power output.

Figure 1:
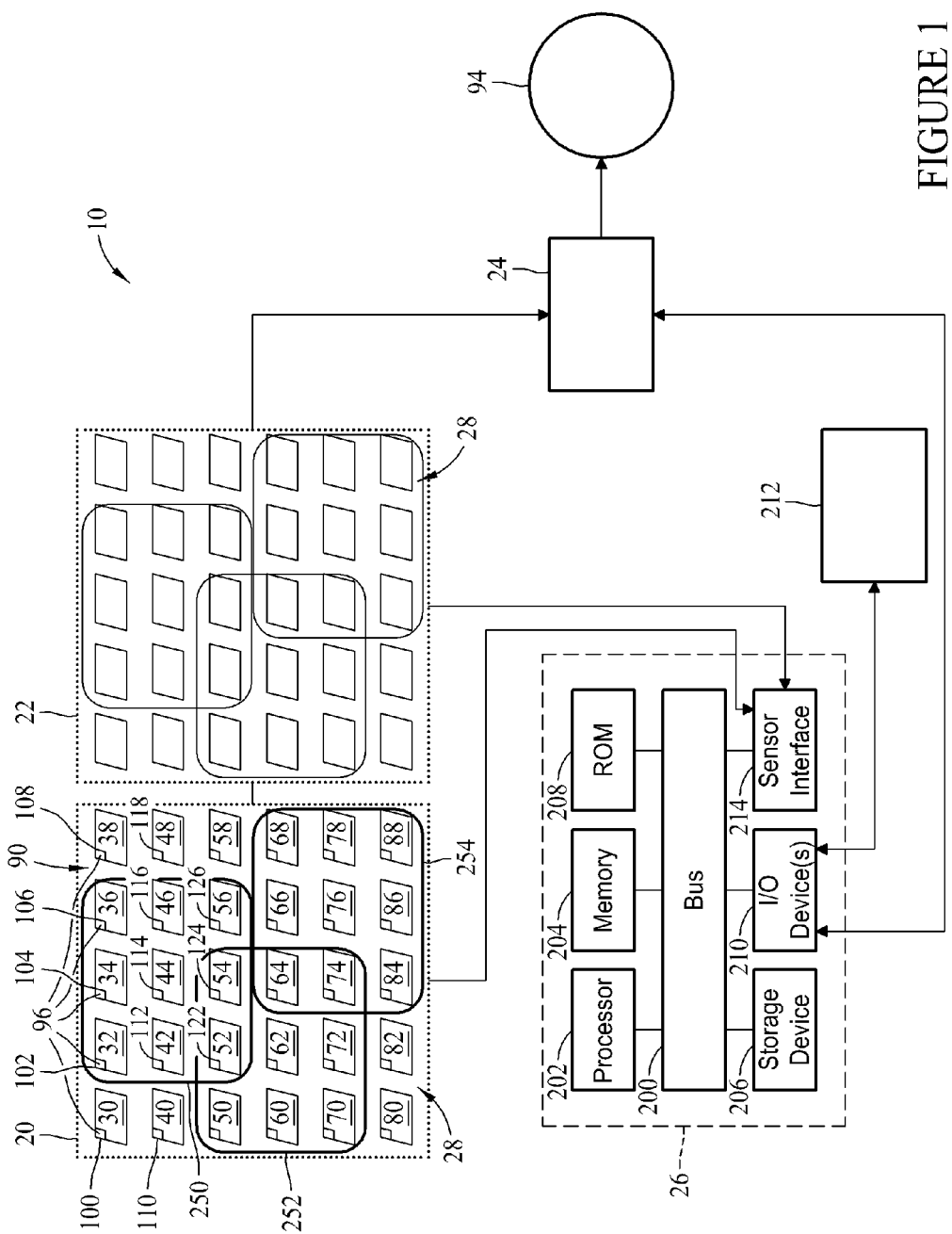
FIG. 1 is a block diagram of an exemplary photovoltaic (PV) power generation system.

FIG. 1 is a block diagram of an exemplary embodiment of a PV power generation system 10. In the exemplary embodiment, system 10 is a solar power generation system that includes a first solar module 20, a second solar module 22, an inverter 24, and a system controller 26. Although shown as including two solar modules, system 10 may include any suitable number of solar modules that allow system 10 to function as described herein. First solar module 20 and second solar module 22 each include a plurality of PV cells, for example, solar cells 28. For example, first solar module 20 includes a first solar cell 30, a second solar cell 32, a third solar cell 34, a fourth solar cell 36, a fifth solar cell 38, a sixth solar cell 40, a seventh solar cell 42, an eighth solar cell 44, a ninth solar cell 46, a tenth solar cell 48, an eleventh solar cell 50, a twelfth solar cell 52, a thirteenth solar cell 54, a fourteenth solar cell 56, a fifteenth solar cell 58, a sixteenth solar cell 60, a seventeenth solar cell 62, an eighteenth solar cell 64, a nineteenth solar cell 66, a twentieth solar cell 68, a twenty-first solar cell 70, a twenty-second solar cell 72, a twenty-third solar cell 74, a twenty-fourth solar cell 76, a twenty-fifth solar cell 78, a twenty-sixth solar cell 80, a twenty-seventh solar cell 82, a twenty-eighth solar cell 84, a twenty-ninth solar cell 86, and a thirtieth solar cell 88. Although thirty solar cells are shown, first solar module 20 may include any suitable number of solar cells that allow first solar module 20 to function as described herein.

The plurality of solar cells 28 include a photovoltaic material that when exposed to solar energy creates a direct current (DC) electric current. A first surface 90 of solar module 20 is exposed to light from, for example, the sun. A second surface (not shown in FIG. 1), opposite to first surface 90, is not exposed to the sun and typically includes connections between the plurality of solar cells 28. A larger amount of power is provided by assembling solar cells into solar modules. The power generated by modules 20 and 22 is provided to inverter 24. Inverter 24 converts the DC power to an alternating current (AC) power and conditions the power for application to an electrical load 94, such as, but not limited to, a power grid, for supplying electrical power generated by solar modules 20 and 22 thereto.

In the exemplary embodiment, solar module 20 includes a plurality of sensors 96, wherein at least one sensor of plurality of sensors 96 is associated with a respective solar cell. For example, first solar cell 30 may include, be coupled to, and/or be positioned near a first irradiance sensor 100. First irradiance sensor 100 detects a flux of radiation, referred to herein as a solar flux, incident on surface 90 of first solar cell 30. First irradiance sensor 100 is positioned to facilitate measuring the solar flux on surface 90 of first solar cell 30. Solar flux is a measure of light available on surface 90 for conversion by a solar cell to electric power.

Similarly, in the exemplary embodiment, a second irradiance sensor 102 measures solar flux on surface 90 of second solar cell 32, a third irradiance sensor 104 measures solar flux on surface 90 of third solar cell 34, a fourth irradiance sensor 106 measures solar flux on surface 90 of fourth solar cell 36, a fifth irradiance sensor 108 measures solar flux on surface 90 of fifth solar cell 38, a sixth irradiance sensor 110 measures solar flux on surface 90 of sixth solar cell 40, a seventh irradiance sensor 112 measures solar flux on surface 90 of seventh solar cell 42, an eighth irradiance sensor 114 measures solar flux on surface 90 of eighth solar cell 44, a ninth irradiance sensor 116 measures solar flux on surface 90 of ninth solar cell 46, a tenth irradiance sensor 118 measures solar flux on surface 90 of tenth solar cell 48, an eleventh irradiance sensor 120 measures solar flux on surface 90 of eleventh solar cell 50, a twelfth irradiance sensor 122 measures solar flux on surface 90 of a twelfth solar cell 52, a thirteenth irradiance sensor 124 measures solar flux on surface 90 of thirteenth solar cell 54, a fourteenth irradiance sensor 126 measures solar flux on surface 90 of fourteenth solar cell 56, a fifteenth irradiance sensor 128 measures solar flux on surface 90 of fifteenth solar cell 58, a sixteenth irradiance sensor 130 measures solar flux on surface 90 of sixteenth solar cell 60, a seventeenth irradiance sensor 132 measures solar flux on surface 90 of seventeenth solar cell 62, an eighteenth irradiance sensor 134 measures solar flux on surface 90 of eighteenth solar cell 64, a nineteenth irradiance sensor 136 measures solar flux on surface 90 of nineteenth solar cell 66, a twentieth irradiance sensor 138 measures solar flux on surface 90 of twentieth solar cell 68, a twenty-first irradiance sensor 140 measures solar flux on surface 90 of twenty-first solar cell 70, a twenty-second irradiance sensor 142 measures solar flux on surface 90 of twenty-second solar cell 72, a twenty-third irradiance sensor 144 measures solar flux on surface 90 of twenty-third solar cell 74, a twenty-fourth irradiance sensor 146 measures solar flux on surface 90 of twenty-fourth solar cell 76, a twenty-fifth irradiance sensor 148 measures solar flux on surface 90 of twenty-fifth solar cell 78, a twenty-sixth irradiance sensor 150 measures solar flux on surface 90 of twenty-sixth solar cell 80, a twenty-seventh irradiance sensor 152 measures solar flux on surface 90 of twenty-seventh solar cell 82, a twenty-eighth irradiance sensor 154 measures solar flux on surface 90 of twenty-eighth solar cell 84, a twenty-ninth irradiance sensor 156 measures solar flux on surface 90 of twenty-ninth solar cell 86, and a thirtieth irradiance sensor 158 measures solar flux on surface 90 of thirtieth solar cell 88. Again, first solar module 20 may include more or less than thirty solar cells.

Each of the plurality of sensors 96 generates a signal representative of the solar flux measured by the sensor. The signal is referred to herein as an irradiance signal. Each of these irradiance signals is provided to system controller 26.

In some embodiments, system controller 26 includes a bus 200 or other communications device to communicate information. One or more processor(s) 202 are coupled to bus 200 to process information, including information from the plurality of sensors 96 and/or other sensor(s). Processor(s) 202 may include at least one computer. As used herein, the term computer is not limited to integrated circuits referred to in the art as a computer, but broadly refers to a processor, a microcontroller, a microcomputer, a programmable logic controller (PLC), an application specific integrated circuit, and other programmable circuits, and these terms are used interchangeably herein.

System controller 26 may also include one or more random access memories (RAM) 204 and/or other storage device(s) 206. RAM(s) 204 and storage device(s) 206 are coupled to bus 200 to store and transfer information and instructions to be executed by processor(s) 202. RAM(s) 204 (and/or storage device(s) 206, if included) can also be used to store temporary variables or other intermediate information during execution of instructions by processor(s) 202. System controller 26 may also include one or more read only memories (ROM) 208 and/or other static storage devices coupled to bus 200 to store and provide static (i.e., non-changing) information and instructions to processor(s) 202. Processor(s) 202 process information transmitted from a plurality of electrical and electronic devices that may include, without limitation, irradiance sensors and power meters. Instructions that are executed include, without limitation, resident conversion and/or comparator algorithms. The execution of sequences of instructions is not limited to any specific combination of hardware circuitry and software instructions.

System controller 26 may also include, or may be coupled to, input/output device(s) 210. Input/output device(s) 210 may include any device known in the art to provide input data to system controller 26 and/or to provide outputs, such as, but not limited to, solar panel positioning outputs and/or inverter control outputs. Instructions may be provided to RAM 204 from storage device 206 including, for example, a magnetic disk, a read-only memory (ROM) integrated circuit, CD-ROM, and/or DVD, via a remote connection that is either wired or wireless providing access to one or more electronically-accessible media. In some embodiments, hard-wired circuitry can be used in place of or in combination with software instructions. Thus, execution of sequences of instructions is not limited to any specific combination of hardware circuitry and software instructions, whether described and/or shown herein. Also, in the exemplary embodiment, input/output device(s) 210 may include, without limitation, computer peripherals associated with an operator interface 212 (e.g., a human machine interface (HMI)) such as a mouse and a keyboard (neither shown in FIG. 1). Furthermore, in the exemplary embodiment, additional output channels may include, for example, an operator interface monitor and/or alarm device (neither shown in FIG. 1). System controller 26 may also include a sensor interface 214 that allows system controller 26 to communicate with plurality of sensors 96 and/or other sensor(s). Sensor interface 214 may include one or more analog-to-digital converters that convert analog signals into digital signals that can be used by processor(s) 202. Irradiance signals from the plurality of sensors 96 are provided to system controller 26 through sensor interface 214.

Power signals are also provided to system controller 26. More specifically, at least one signal is provided to system controller 26 that includes data used by system controller 26 to determine a power output of each of the plurality of solar cells 28. System controller 26 determines power output of, for example, first solar cell 30, second solar cell 32, third solar cell 34, and/or fourth solar cell 36. For example, a power meter (not shown in FIG. 1) may be included within solar module 20 and configured to provide a power signal to system controller 26 that is proportionate to power output of first solar cell 30. Alternatively, a voltage sensor (not shown in FIG. 1) and a current sensor (not shown in FIG. 1) may be included within solar module 20. The voltage sensor and current sensor measure a voltage and a current generated by first solar cell 30, and provide signals to system controller 26 that correspond to the measured voltage and current. System controller 26 uses the measured voltage and current to determine power output by first solar cell 30.

In the exemplary embodiment, system controller 26 identifies faulty sensors within system 10. A faulty sensor is defined herein as a sensor that does not provide system controller 26 with a signal that accurately represents a parameter being measured. More specifically, a faulty irradiance sensor is defined herein as an irradiance sensor that does not provide system controller 26 with an irradiance signal that accurately represents the actual solar flux on surface 90 of the corresponding solar cell. For example, system controller 26 may receive an irradiance signal from second irradiance sensor 102 that corresponds to zero irradiance at second solar cell 32. This irradiance signal may accurately represent the actual solar flux incident on second solar cell 32, or more specifically, accurately represent a lack of solar flux incident on second solar cell 32. In other words, a functioning sensor provides system controller 26 with an irradiance signal that corresponds to zero irradiance when no light is incident on the sensor. However, if second irradiance sensor 102 is faulty, system controller 26 may receive an irradiance signal from sensor 102 that corresponds to zero irradiance at second solar cell 32 even if there is light incident on second solar cell 32.

System controller 26 applies rules to determine if second irradiance sensor 102 is faulty. If a rule is violated, systems controller 26 indicates the sensor is faulty, for example, by generating an alarm signal. System controller 26 continuously compares the irradiance signal from second irradiance sensor 102 to at least one other irradiance signal provided by an irradiance sensor neighboring second irradiance sensor 102. If the irradiance signals are different, system controller 26 compares the power output of second solar cell 32 to the power output of at least one other neighboring solar cell. Although described above as continuously comparing irradiance signals and power outputs, system controller 26 may periodically or intermittently compare irradiance signals and power outputs in order to monitor operation of second irradiance sensor 102.

For example, system controller 26 may compare the irradiance signal from second irradiance sensor 102 and an irradiance signal from seventh irradiance sensor 112. A neighboring sensor is a sensor directly adjacent second irradiance sensor 102, or near enough to second irradiance sensor 102 that the irradiance signal provides system controller 26 with an indication of whether second irradiance sensor 102 is providing an accurate irradiance signal. Examples of sensors neighboring second irradiance sensor 102 are first irradiance sensor 100, third irradiance sensor 104, sixth irradiance sensor 110, seventh irradiance sensor 112, and eighth irradiance sensor 114. For example, if system controller 26 receives an irradiance signal from second irradiance sensor 102 indicating that there is zero solar flux at surface 90 of second solar cell 32, and receives an irradiance signal from seventh irradiance sensor 112 indicating that there is zero solar flux at surface 90 of seventh solar cell 42, system controller 26 determines that second irradiance sensor 102 is properly functioning and providing an irradiance signal that accurately represents the solar flux on surface 90 of solar cell 32. In the exemplary embodiment, an irradiance threshold is stored, for example, in ROM 208. If a difference between the irradiance signal from second irradiance sensor 102 and the irradiance signal from seventh irradiance sensor 112 is less than or equal to the irradiance threshold, system controller 26 determines that the signals are substantially similar and that second irradiance sensor 102 is functioning properly.

If the difference between the irradiance signal from second irradiance sensor 102 and the irradiance signal from seventh irradiance sensor 112 is greater than the irradiance threshold, system controller 26 determines that the signals are substantially different and compares the power output of second solar cell 32 and the power output of seventh solar cell 42. If the power output of second solar cell 32 is substantially similar to the power output of seventh solar cell 42, system controller 26 determines that second irradiance sensor 102 is not functioning properly. In the exemplary embodiment, a power threshold is stored, for example, in ROM 208. The power outputs are substantially similar if the difference between power outputs is less than or equal to the power threshold. This series of comparisons provides system controller 26 with data indicating that second solar cell 32 and seventh solar cell 42 have substantially similar power output, which corresponds to a substantially equal solar flux received at both second irradiance sensor 102 and seventh irradiance sensor 112. However, the actual irradiance signals provided by second irradiance sensor 102 and seventh irradiance sensor 112 do not support this determination, leading to the conclusion that second irradiance sensor 102 is faulty.

Furthermore, if system controller 26 determines that the irradiance signal from second irradiance sensor 102 is not substantially similar to the irradiance signal from seventh irradiance sensor 112, and system controller 26 determines that the power output of second solar cell 32 is not substantially similar to the power output of seventh solar cell 42, system controller 26 compares the irradiance signal from second irradiance sensor 102 and the power output of second solar cell 32 to stored historical data to determine if second irradiance sensor 102 is faulty. Historical data may include typical power output values for various dates and/or times determined from, for example, historical weather data and/or irradiance level data. For example, historical data may be stored in ROM 208 and accessed by processor 202 to determine if the power output of second solar cell 32 is within a predefined range of the typical power output value for the date and/or time the power was determined. Furthermore, processor 202 may analyze irradiance signals from second sensor 102 over time, for example, over the past twenty-four hours, to determine if the irradiance signal varies as expected (e.g., low irradiance signal at night, increasing at sunrise). Comparing the irradiance signal and/or power output to historical data allows system controller 26 to determine whether a sensor is operational even when multiple solar cells are not producing power and irradiance sensor values are showing zero or low solar flux.

In an alternative embodiment, system controller 26 compares the irradiance signal from second irradiance sensor 102 to irradiance signals from a plurality of neighboring irradiance sensors. In this embodiment, the plurality of sensors 96, and corresponding solar cells 28, are divided into a plurality of groups. For example, the plurality of sensors 96 is divided into a first group 250, a second group 252, and a third group 254. First group 250, second group 252, and third group 254 may be defined by a user, for example, by selecting sensors using operator interface 212. Alternatively, the plurality of sensors 96 may be automatically partitioned into groups by system controller 26 or partitioned in any other suitable manner that allows system 10 to function as described herein.

In the alternative embodiment, to determine if second irradiance sensor 102 is functioning properly, system controller 26 compares the irradiance signal from second irradiance sensor 102 to an average of the irradiance signals provided by the remaining sensors in first group 250 (i.e., third irradiance sensor 104, fourth irradiance sensor 106, seventh irradiance sensor 112, eighth irradiance sensor 114, ninth irradiance sensor 116, twelfth irradiance sensor 122, thirteenth irradiance sensor 124, and fourteenth irradiance sensor 126). An average, as referred to herein, may include an arithmetic mean, a median, a mode, or any other suitable representation of a central tendency that allows system 10 to function as described herein. If the irradiance signal from second irradiance sensor 102 is substantially similar to the average irradiance signal provided by each of the remaining sensors in first group 250, system controller 26 determines that second irradiance sensor 102 is functioning properly. As described above, system controller 26 applies the irradiance threshold stored in ROM 208 to determine if the signals are substantially similar.

If system controller 26 identifies a substantial difference between the irradiance signal from second irradiance sensor 102 and the average of the irradiance signals, system controller 26 compares the power output by each solar cell of the plurality of solar cells in first group 250 to an average of the power output of the remaining solar cells within first group 250. If the power output of, for example, second solar cell 32, is substantially similar to the average power output of the remaining solar cells, system controller 26 determines that second irradiance sensor 102 is not functioning properly. Furthermore, system controller 26 determines a number of the plurality of solar cells in first group 250 that are substantially different than an average of the power output of the remaining solar cells within first group 250. As described above, system controller 26 applies the power threshold to determine if the power outputs are substantially similar or different. This series of comparisons provides system controller 26 with data indicating that second solar cell 32 has a power output that is substantially similar to the power output of the other solar cells within first group 250, which corresponds to a substantially equal solar flux incident on all of the solar cells in first group 250. However, the actual irradiance signal provided by second irradiance sensor 102 does not support this determination, leading to the conclusion that second irradiance sensor 102 is faulty.

Furthermore, if system controller 26 determines that the irradiance signal from second irradiance sensor 102 is not substantially similar to the average of the irradiance signals provided by the remaining sensors in first group 250, and system controller 26 determines that the power generated by second solar cell 32 is not substantially similar to the average of the power generated by the remaining solar cells within first group 250, system controller 26 compares the irradiance signal from second irradiance sensor 102 and the power generated by second solar cell 32 to stored historical data to determine if second irradiance sensor 102 is faulty. For example, historical data may be stored in ROM 208 and accessed by processor 202 to determine if the power output of second solar cell 32 is within a predefined range of the typical power output value for the date and time the power is determined. Furthermore, processor 202 may analyze the irradiance signal from second irradiance sensor 102 over time, for example, over the past twenty-four hours, to determine if the irradiance signal varies as expected. Moreover, the historical data of the plurality of irradiance sensors can be used to trace the faults in multiple sensors simultaneously.

System controller 26 provides operator interface 212 with a faulty sensor signal when it is determined that at least one of the plurality of sensors 96 is not functioning properly. The faulty sensor signal includes a description identifying which of the plurality of sensors 96 was determined to be faulty. Operator interface 212 may display an alarm for viewing by a user. Operator interface 212 may also sound an audio alarm, light a visual indicator, and/or provide any other indication that a sensor within the plurality of sensors 96 is not functioning properly.

Although described above with respect to second irradiance sensor 102, system controller 26 monitors operation of each sensor included within solar power generation system 10.

Figure 2:
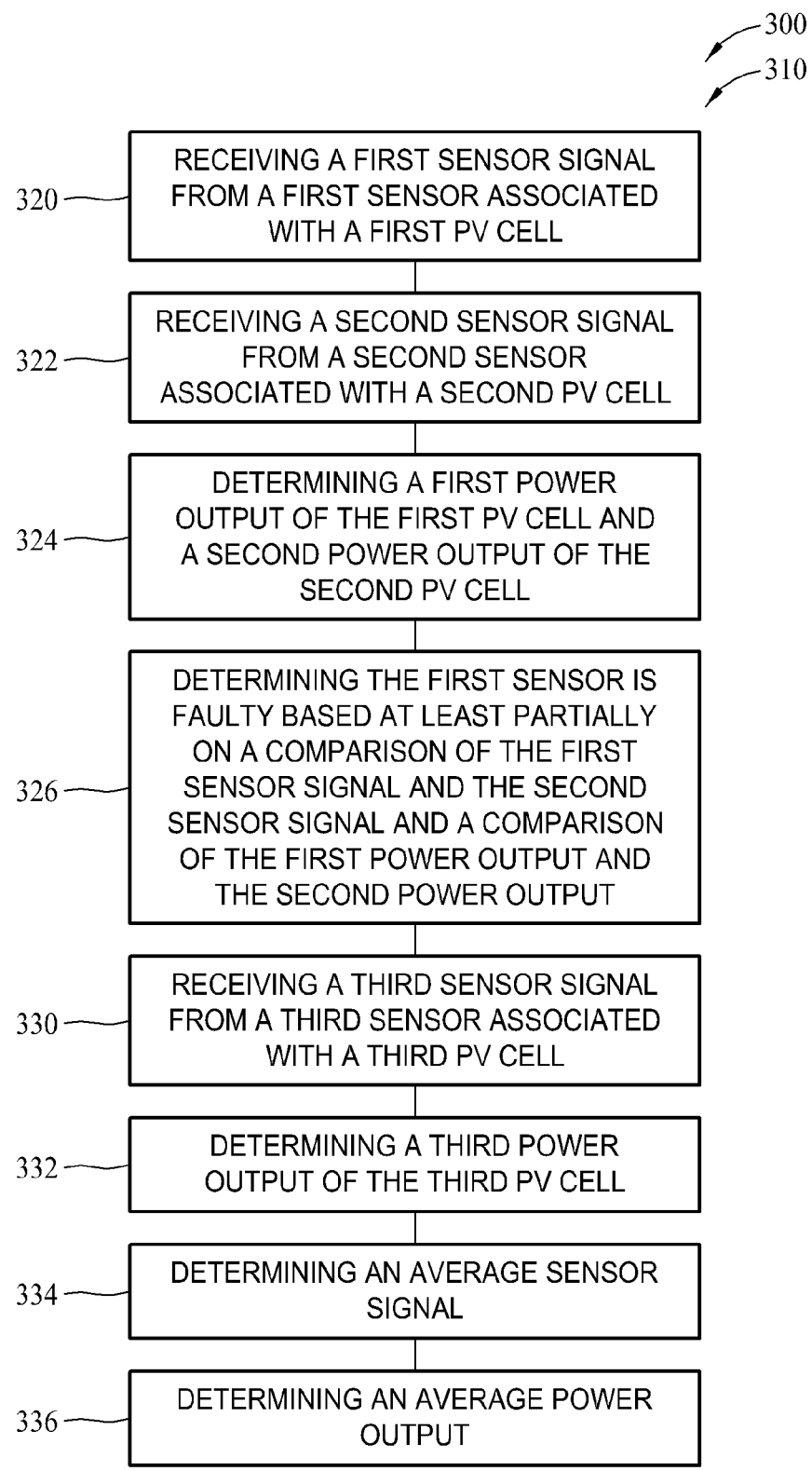
FIG. 2 is a flow chart of an exemplary method for monitoring operation of a plurality of sensors included in the PV power generation system shown in FIG. 1.

FIG. 2 is a flow chart 300 of an exemplary method 310 for monitoring operation of a plurality of sensors, for example, plurality of sensors 90 (shown in FIG. 1), included in PV power generation system 10 (shown in FIG. 1). As described above, PV power generation system 10 includes plurality of solar cells 28 and a plurality of sensors 96. In the exemplary embodiment, method 310 includes receiving 320 a first sensor signal from a first sensor associated with a first solar cell of plurality of solar cells 28. For example, a first sensor signal (i.e., an irradiance signal) is received 320 from second irradiance sensor 102, which is associated with second solar cell 32. Method 310 also includes receiving 322 a second sensor signal from a second sensor associated with a second solar cell of plurality of solar cells 28. For example, a second sensor signal (i.e., an irradiance signal) is received 322 from seventh irradiance sensor 112, which is associated with seventh solar cell 42. Method 310 also includes determining 324 a first power output of second solar cell 32 and a second power output of seventh solar cell 42.

In the exemplary embodiment, method 310 also includes determining 326 second sensor 102 is faulty based at least partially on a comparison of the first sensor signal and the second sensor signal and a comparison of the first power output and the second power output. More specifically, determining 326 second sensor 102 is faulty includes determining that the first sensor signal is different from the second sensor signal and determining that the first power output is substantially similar to the second power output.

Furthermore, determining 326 second sensor 102 is faulty includes determining that the first sensor signal is different from the second sensor signal, determining that the first power output is different from the second power output, and determining that at least one of the first power output and the first sensor signal is different from stored historical data. For example, the first power output may be determined to be different from the second power output when a difference between the first power output and the second power output is greater than or equal to a stored power output threshold value. Furthermore, the first power output may be determined to be different from stored historical data when a difference between the first power output and stored historical power output data is greater than or equal to a stored power output threshold value. Moreover, the first sensor signal may be determined to be different from stored historical data when a difference between the first sensor signal and stored historical sensor signal data is greater than or equal to a stored sensor signal threshold value.

In an alternative embodiment, method 310 may also include receiving 330 a third sensor signal from a third sensor associated with a third solar cell. For example, a third sensor signal (i.e., an irradiance signal) is received 330 from third irradiance sensor 104, which is associated with third solar cell 34. Method 310 also includes determining 332 a third power output of third solar cell 34, and determining 334 an average sensor signal, for example, by averaging the second sensor signal and the third sensor signal. Method 310 also includes determining 336 an average power output, for example, by averaging the second power output and the third power output.

In the alternative embodiment, second irradiance sensor 102 is determined to be faulty based at least partially on a comparison of the first sensor signal and the average sensor signal and a comparison of the first power output and the average power output. The first sensor, second sensor, and third sensor are selected from plurality of sensors 96 based on a relative location of the first sensor, second sensor, and third sensor.

Furthermore, one or more computer-readable media having computer-executable components, may be configured for monitoring operation of a plurality of sensors, for example, plurality of sensors 96 (shown in FIG. 1). The computer-executable components may include: an interface component that, when executed by at least one processor, causes the at least one processor to receive a first sensor signal, a second sensor signal, a first power output, and a second power output; a memory component that, when executed by at least one processor, causes the at least one processor to store at least one algorithm for comparing the first sensor signal, the second sensor signal, the first power output, and the second power output; and an analysis component that, when executed by at least one processor, causes the at least one processor to identify faulty sensors within the plurality of sensors.

The embodiments described herein embrace one or more computer readable media, wherein each medium may be configured to include, or includes thereon, data or computer executable instructions for manipulating data. The computer executable instructions include data structures, objects, programs, routines, or other program modules that may be accessed by a processing system, such as one associated with a general-purpose computer capable of performing various different functions or one associated with a special-purpose computer capable of performing a limited number of functions. Computer executable instructions cause the processing system to perform a particular function or group of functions and are examples of program code means for implementing steps for methods disclosed herein. Furthermore, a particular sequence of the executable instructions provides an example of corresponding acts that may be used to implement such steps. Examples of computer readable media include random-access memory ("RAM"), read-only memory ("ROM"), programmable read-only memory ("PROM"), erasable programmable read-only memory ("EPROM"), electrically erasable programmable read-only memory ("EEPROM"), compact disk read-only memory ("CD-ROM"), or any other device or component that is capable of providing data or executable instructions that may be accessed by a processing system.

A computer or computing device such as described herein has one or more processors or processing units, system memory, and some form of computer readable media. By way of example and not limitation, computer readable media comprise computer storage media and communication media. Computer storage media include volatile and nonvolatile, removable and non-removable media implemented in any method or technology for storage of information such as computer readable instructions, data structures, program modules or other data. Communication media typically embody computer readable instructions, data structures, program modules, or other data in a modulated data signal such as a carrier wave or other transport mechanism and include any information delivery media. Combinations of any of the above are also included within the scope of computer readable media.

The computer may operate in a networked environment using logical connections to one or more remote computers, such as a remote computer. Although described in connection with an exemplary computing system environment, embodiments of the invention are operational with numerous other general purpose or special purpose computing system environments or configurations. The computing system environment is not intended to suggest any limitation as to the scope of use or functionality of the embodiments described herein. Moreover, the computing system environment should not be interpreted as having any dependency or requirement relating to any one or combination of components illustrated in the exemplary operating environment. Examples of well known computing systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

The methods and systems described herein use data, both real time and historical, from neighboring sensors to identify faulty sensors. Neighboring sensors are defined based on the physical location of the solar cells and irradiance sensors. The solar cells are categorized as groups and neighbors, for example, by a user at an HMI. The information related to the groups is stored in a memory. A neighborhood rule engine continuously traces the real time power output and irradiance values provided by sensors included within the solar module. Whenever a deviation in the power output of the selected neighbors is identified, the irradiance values are compared to identify a similar deviation, and vice versa. The neighborhood rule engine may also compare stored historical data to the real time power output and/or the irradiance values for further analysis. Whenever a sensor is determined to be faulty, an alarm is raised and displayed at the HMI. Although described herein with respect to irradiance sensors, the methods and systems described herein may also be applied to other types of sensors included within system 10.

Automatic identification of a faulty irradiance sensor in a solar power generation system is provided by analyzing irradiance sensor data and corresponding power. If the irradiance sensor signal is displayed as low or high, whereas the power is displayed as a normal value, the systems and methods described herein trigger an alarm based on neighboring sensor data that identifies the problem area and avoids the necessity of root cause analysis (RCA).

The above-described embodiments facilitate efficient and cost-effective operation of a solar power generation system. The control system described herein automatically identifies sensors that are not functioning properly. Furthermore, an alarm is raised when a faulty sensor is identified, providing a user with an indication that the sensor is faulty.

Exemplary embodiments of a solar power generation system are described above in detail. The methods and systems are not limited to the specific embodiments described herein, but rather, components of the systems and/or steps of the methods may be utilized independently and separately from other components and/or steps described herein.

Embodiments described herein may be described in the general context of computer-executable instructions, such as program modules, executed by one or more computers or other devices. The computer-executable instructions may be organized into one or more computer-executable components or modules. Generally, program modules include, but are not limited to, routines, programs, objects, components, and data structures that perform particular tasks or implement particular abstract data types. Aspects of the disclosure described herein may be implemented with any number and organization of such components or modules. For example, aspects of the disclosure are not limited to the specific computer-executable instructions or the specific components or modules illustrated in the figures and described herein. Other embodiments may include different computer-executable instructions or components having more or less functionality than illustrated and described herein. Aspects of the disclosure may also be practiced in distributed computing environments where tasks are performed by remote processing devices that are linked through a communications network. In a distributed computing environment, program modules may be located in both local and remote computer storage media including memory storage devices.

Aspects of the disclosure transform a general-purpose computer into a special-purpose computing device when configured to execute the instructions described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A photovoltaic (PV) power generation system, comprising:
   at least one PV module comprising a plurality of PV cells;
   a plurality of sensors; and,
   a processing device communicatively coupled to said plurality of sensors, said processing device configured to:
      determine a power output of each of said plurality of PV cells;
      receive data from said plurality of sensors; and,
      identify a faulty sensor within said plurality of sensors based at least partially on the determined power output and the received data.

2. A system in accordance with claim 1, wherein said plurality of sensors comprises:
   a first irradiance sensor associated with a first PV cell of said plurality of PV cells and configured to output a first irradiance signal associated with a solar flux at a surface of said first PV cell; and,
   a second irradiance sensor associated with a second PV cell of said plurality of PV cells and configured to output a second irradiance signal associated with a solar flux at a surface of said second PV cell.

3. A system in accordance with claim 2, wherein said processing device is further configured to determine a first power output of said first PV cell and a second power output of said second PV cell.

4. A system in accordance with claim 3, wherein said processing device is configured to identify said first irradiance sensor as faulty based on a comparison of said first irradiance signal and said second irradiance signal and a comparison of said first power output and said second power output.

5. A system in accordance with claim 3, wherein said processing device is further configured to generate a faulty sensor alarm signal when said first irradiance signal is different than said second irradiance signal and a difference between said first power output and said second power output is less than or equal to a predefined threshold value.

6. A system in accordance with claim 3, further comprising a memory device configured to store at least one of historical operating data and threshold values defining acceptable variance between irradiance signals and between power outputs.

7. A system in accordance with claim 6, wherein said processing device is further configured to identify said first irradiance sensor as faulty when said first irradiance signal is different than said second irradiance signal, said first power output is different than said second power output, and at least one of said first irradiance signal and said first power output is different than stored historical data.

8. A control system configured to identify faulty sensors within a photovoltaic (PV) power generation system that includes a plurality of photovoltaic (PV) cells, said control system including a processing device coupled to a plurality of sensors, each of the plurality of sensors associated with a PV cell of the plurality of PV cells, said processing device configured to:
   receive sensor signals from each of the plurality of sensors including a first sensor signal from a first sensor associated with a first PV cell;
   determine a sensor signal average;

determine a power output of each of the plurality of PV cells including a first power output of the first PV cell;
determine an average power output; and,
identify that the first sensor is faulty based at least partially on a comparison of the first sensor signal and the sensor signal average and a comparison of the first power output and the average power output.

9. A control system in accordance with claim 8, wherein said processing device is further configured to:
determine the sensor signal average based on the sensor signals output by the plurality of sensors other than the first sensor; and,
determine the average power output based on the power output of the plurality of PV cells other than the first PV cell.

10. A control system in accordance with claim 8, wherein said processing device is further configured to:
determine if the first sensor signal is different from the sensor signal average;
determine if a difference between the first power output and the average power output is less than or equal to a predefined power output threshold value; and,
generate an alarm signal indicating that the first sensor is faulty when the first sensor signal is different from the sensor signal average and the difference between the first power output and the average power output is less than or equal to the predefined power output threshold value.

11. A control system in accordance with claim 8, wherein said processing device is further configured to:
determine if the first sensor signal is different from the sensor signal average;
determine if the first power output is different from the average power output; and,
compare at least one of the first sensor signal and the first power output to stored historical data to determine if the first sensor is faulty when the first sensor signal is different from the second sensor signal and the first power output is different from the average power output.

12. A control system in accordance with claim 8, wherein said processing device is further configured to access stored threshold values that define an acceptable variance between irradiance signals and between power outputs.

13. A method for monitoring operation of a first sensor of a plurality of sensors within a photovoltaic (PV) power generation system, the PV power generation system including a plurality of photovoltaic (PV) cells and a system controller, said method comprising:
receiving, at the system controller, a first sensor signal from the first sensor, the first sensor associated with a first PV cell of the plurality of PV cells;
receiving, at the system controller, a second sensor signal from a second sensor, the second sensor associated with a second PV cell of the plurality of PV cells;
determining, using the controller, a first power output of the first PV cell and a second power output of the second PV cell; and,
determining, using the system controller, the first sensor is faulty based at least partially on a comparison of the first sensor signal and the second sensor signal and a comparison of the first power output and the second power output.

14. A method in accordance with claim 13, further comprising generating an alarm signal that identifies the first sensor as faulty.

15. A method in accordance with claim 13, wherein determining the first sensor is faulty comprises:
determining, using the system controller, that the first sensor signal is different from the second sensor signal; and,
determining, using the system controller, that a difference between the first power output and the second power output is less than or equal to a predefined power output threshold value.

16. A method in accordance with claim 13, wherein determining the first sensor is faulty comprises:
determining that the first sensor signal is different from the second sensor signal;
determining that the first power output is different from the second power output; and,
determining that at least one of the first sensor signal and the first power output is different from stored historical data.

17. A method in accordance with claim 13, further comprising:
receiving, at the system controller, a third sensor signal from a third sensor associated with a third PV cell of the plurality of PV cells; and,
determining a third power output of the third PV cell.

18. A method in accordance with claim 17, further comprising:
averaging the second sensor signal and the third sensor signal to determine an average sensor signal; and,
averaging the second power output and the third power output to determine an average power output.

19. A method in accordance with claim 18, further comprising determining the first sensor is faulty based at least partially on a comparison of the first sensor signal and the average sensor signal and a comparison of the first power output and the average power output.

20. A method in accordance with claim 13, further comprising selecting the first sensor, the second sensor, and the third sensor from the plurality of sensors based on a relative location of the first sensor, the second sensor, and the third sensor.

* * * * *